United States Patent
Li et al.

(10) Patent No.: US 10,256,372 B2
(45) Date of Patent: Apr. 9, 2019

(54) DISPLAY DEVICE

(71) Applicant: PlayNitride Inc., Tainan (TW)

(72) Inventors: Yun-Li Li, Tainan (TW); Yu-Hung Lai, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/841,290

(22) Filed: Dec. 14, 2017

(65) Prior Publication Data
US 2018/0190878 A1     Jul. 5, 2018

(30) Foreign Application Priority Data

Dec. 30, 2016 (TW) .............................. 105144012 A

(51) Int. Cl.
| | |
|---|---|
| *H01L 33/60* | (2010.01) |
| *H01L 29/20* | (2006.01) |
| *H01L 33/46* | (2010.01) |
| *G02B 5/08* | (2006.01) |
| *H01L 25/075* | (2006.01) |
| *H01L 33/62* | (2010.01) |
| *H01L 33/38* | (2010.01) |
| *H01L 33/10* | (2010.01) |
| *H01L 33/08* | (2010.01) |

(52) U.S. Cl.
CPC ............ *H01L 33/465* (2013.01); *G02B 5/085* (2013.01); *H01L 25/0753* (2013.01); *H01L 33/60* (2013.01); *H01L 33/62* (2013.01); *H01L 33/08* (2013.01); *H01L 33/10* (2013.01); *H01L 33/382* (2013.01); *H01L 2933/0016* (2013.01)

(58) Field of Classification Search
CPC . H01L 33/105; H01L 33/465; H01L 25/0753; H01L 33/60; H01L 33/62; H01L 33/382; H01L 33/05; H01L 33/10; H01L 33/08; H01L 2933/0016; H01L 2933/0025; H01L 2923/0058; G02B 5/085
USPC ................ 257/89, 98, 99, E21.108, E33.07; 438/22, 29, 25, 27
See application file for complete search history.

(56) References Cited

U.S. PATENT DOCUMENTS

| | | | |
|---|---|---|---|
| 2004/0062283 A1* | 4/2004 | Takeuchi | ............ H01S 5/32341 372/45.01 |
| 2016/0111594 A1* | 4/2016 | Nagel | ..................... H01L 33/04 257/13 |

FOREIGN PATENT DOCUMENTS

| | | |
|---|---|---|
| TW | 200929758 | 7/2009 |
| TW | 201513507 | 4/2015 |

* cited by examiner

*Primary Examiner* — Thinh T Nguyen
(74) *Attorney, Agent, or Firm* — JCIPRNET

(57) ABSTRACT

A display device including a backplane, a plurality of light-emitting devices, a first distributed Bragg reflector layer and a second distributed Bragg reflector layer is provided. The light-emitting devices are disposed on the backplane. The first distributed Bragg reflector layer is disposed between the backplane and the light-emitting devices. The light-emitting devices are disposed between the first distributed Bragg reflector layer and the second distributed Bragg reflector layer. A projected area of the first distributed Bragg reflector layer on the backplane is larger than a projected area of one of the light-emitting devices on the backplane or a projected area of the second distributed Bragg reflector layer on the backplane is larger than a projected area of one light-emitting device on the backplane.

16 Claims, 7 Drawing Sheets

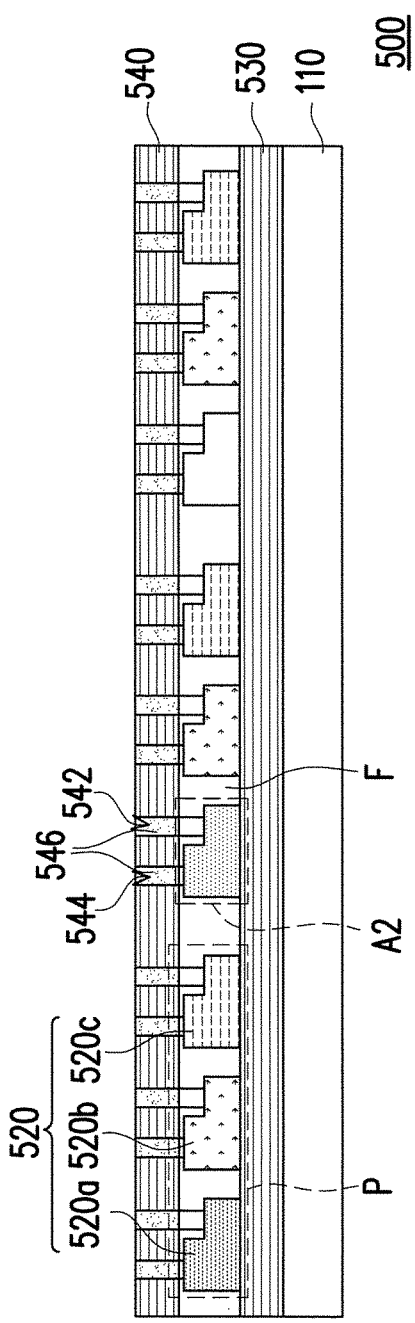
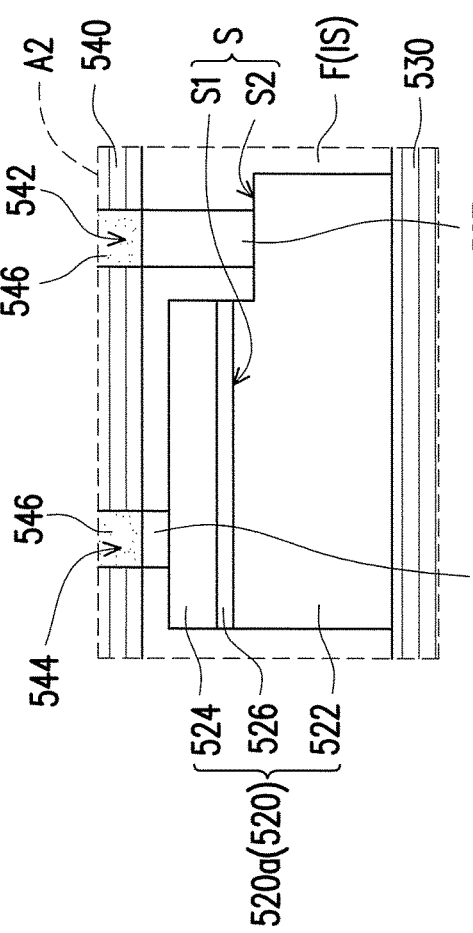
FIG. 5A
FIG. 5B

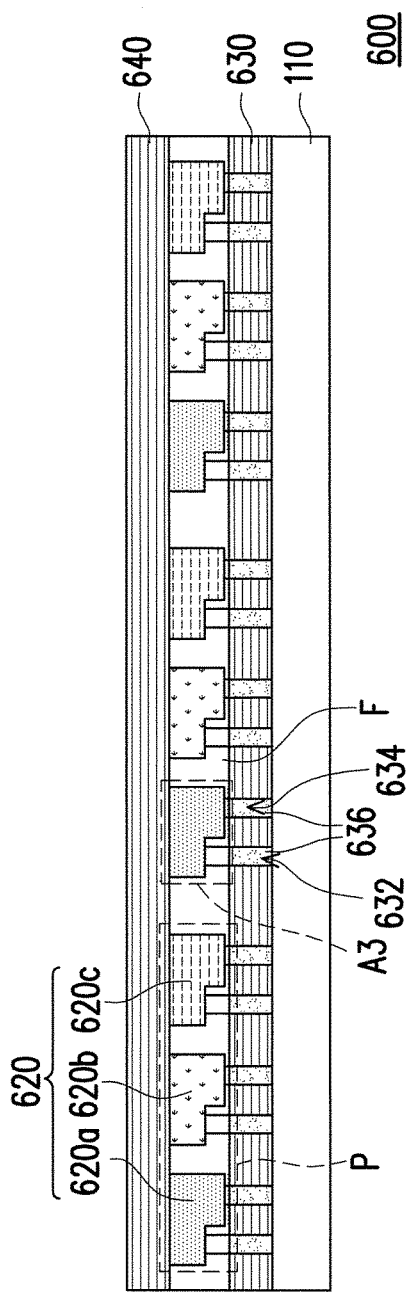
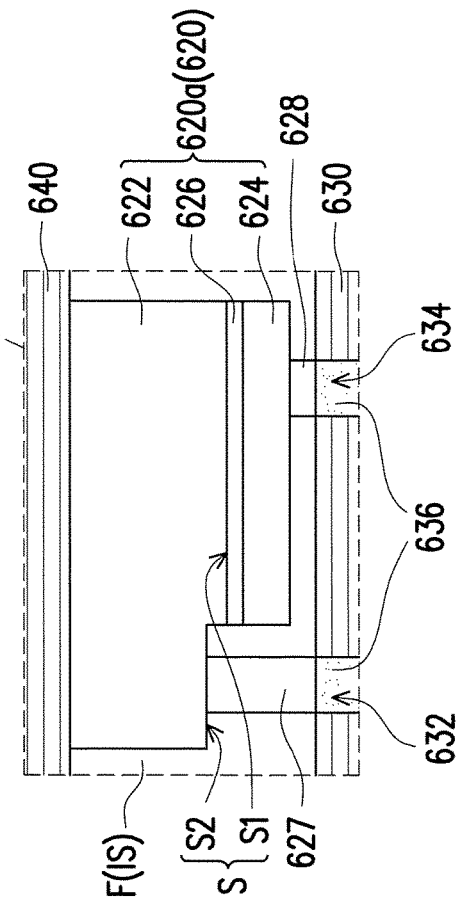
FIG. 6A
FIG. 6B

DISPLAY DEVICE

CROSS-REFERENCE TO RELATED APPLICATION

This application claims the priority benefit of Taiwan application serial no. 105144012, filed on Dec. 30, 2016. The entirety of the above-mentioned patent application is hereby incorporated by reference herein and made a part of this specification.

BACKGROUND OF THE INVENTION

1. Field of the Invention

The invention relates to a display device.

2. Description of Related Art

With progress in optoelectronic technology, many optoelectronic components are developed to be more compact in size. In recent years, thanks to the breakthrough in manufacturing light-emitting diodes (LED), the micro-LED display that is formed by arranging light-emitting diodes in an array has been developed. The micro-LED display has not only better performance in contrast and energy consumption than an organic light-emitting diode (OLED) display but also is visible under the sun. Since the micro-LED display uses an inorganic material, it also has better reliability and longer life time than the OLED display. Now the micro-LED display has proved its value in the market, and the studying of micro-LED are drawing more and more attention, for example, how to lower the manufacturing difficulty and enhance the brightness, color performance, and so on.

SUMMARY OF THE INVENTION

The invention provides a display device which displays images with high color purity. In addition, the display device is easy to manufacture and has favorable cost-effectiveness.

The display device of the invention includes a backplane, a plurality of light-emitting devices, a first distributed Bragg reflector structure, and a second distributed Bragg reflector structure. The light-emitting devices are arranged and disposed on the backplane. The first distributed Bragg reflector structure is disposed between the backplane and the light-emitting devices. The light-emitting devices are disposed between the first distributed Bragg reflector structure and the second distributed Bragg reflector structure. A projected area of the first distributed Bragg reflector structure or the second distributed Bragg reflector structure on the backplane is larger than a projected area of one light-emitting device on the backplane.

In an embodiment of the invention, each of the light-emitting devices includes a first type doped semiconductor layer, a light-emitting layer, and a second type doped semiconductor layer. The light-emitting layer is disposed between the first type doped semiconductor layer and the second type doped semiconductor layer. The first type doped semiconductor layer is disposed between the light-emitting layer and the first distributed Bragg reflector structure, and the second type doped semiconductor layer is disposed between the second distributed Bragg reflector structure and the light-emitting layer. At least one of the first distributed Bragg reflector structure and the second distributed Bragg reflector structure is electrically conductive.

In an embodiment of the invention, the first distributed Bragg reflector structure is electrically conductive. The first distributed Bragg reflector structure includes a plurality of sub Bragg reflector structures that are separated from one another, and the first type doped semiconductor layer of each of the light-emitting devices is electrically connected with one of the sub Bragg reflector structures.

In an embodiment of the invention, the second distributed Bragg reflector structure is electrically conductive, and the second type doped semiconductor layers of the light-emitting devices are together electrically connected with the second distributed Bragg reflector structure.

In an embodiment of the invention, the second distributed Bragg reflector structure is not electrically conductive. The second distributed Bragg reflector structure includes a plurality of conductive through holes, and the second type doped semiconductor layer of each of the light-emitting devices is electrically connected with one of the conductive through holes.

In an embodiment of the invention, the first distributed Bragg reflector structure is not electrically conductive while the second distributed Bragg reflector structure is electrically conductive. The first distributed Bragg reflector structure includes a plurality of conductive through holes. The first type doped semiconductor layer of each of the light-emitting devices is electrically connected with one of the conductive through holes, and the second type doped semiconductor layers of the light-emitting devices are together electrically connected with the second distributed Bragg reflector structure.

In an embodiment of the invention, a material of at least one of the first distributed Bragg reflector structure and the second distributed Bragg reflector structure includes silver.

In an embodiment of the invention, each of the light-emitting devices includes a first type doped semiconductor layer, a light-emitting layer, and a second type doped semiconductor layer. The light-emitting layer is disposed between the first type doped semiconductor layer and the second type doped semiconductor layer. The first type doped semiconductor layer is disposed between the light-emitting layer and the first distributed Bragg reflector structure, and the second type doped semiconductor layer is disposed between the second distributed Bragg reflector structure and the light-emitting layer. At least one of the first distributed Bragg reflector structure and the second distributed Bragg reflector structure is not electrically conductive.

In an embodiment of the invention, the first distributed Bragg reflector structure and the second distributed Bragg reflector structure are not electrically conductive. The first distributed Bragg reflector structure includes a plurality of first conductive through holes and the first type doped semiconductor layer of each of the light-emitting devices is electrically connected with one of the first conductive through holes. The second distributed Bragg reflector structure includes a plurality of second conductive through holes, and the second type doped semiconductor layer of each of the light-emitting devices is electrically connected with one of the second conductive through holes.

In an embodiment of the invention, the first distributed Bragg reflector structure is not electrically conductive. The first distributed Bragg reflector structure includes a plurality of first conductive through holes and a plurality of second conductive through holes. The first type doped semiconductor layer of each of the light-emitting devices is electrically connected with one of the first conductive through holes, and the second type doped semiconductor layer of each of the light-emitting devices is electrically connected with one of the second conductive through holes.

In an embodiment of the invention, the second distributed Bragg reflector structure is not electrically conductive. The second distributed Bragg reflector structure includes a plurality of first conductive through holes and a plurality of second conductive through holes. The first type doped semiconductor layer of each of the light-emitting devices is electrically connected with one of the first conductive through holes, and the second type doped semiconductor layer of each of the light-emitting devices is electrically connected with one of the second conductive through holes.

In an embodiment of the invention, at least one of the first distributed Bragg reflector structure and the second distributed Bragg reflector structure includes a multilayer film.

In an embodiment of the invention, a reflectivity of the first distributed Bragg reflector structure is different from a reflectivity of the second distributed Bragg reflector structure.

In an embodiment of the invention, each of the light-emitting devices is a micro-LED chip, and a diagonal length of each of the light-emitting devices falls in a range of 2 μm to 150 μm.

In an embodiment of the invention, the light-emitting devices emit lights of different colors.

Based on the above, in the display device of the embodiments of the invention, the first distributed Bragg reflector layer is disposed between the backplane and the light-emitting devices, and the light-emitting devices are disposed between the first distributed Bragg reflector layer and the second distributed Bragg reflector layer. The light emitted by the light-emitting devices is reflected between the first distributed Bragg reflector layer and the second distributed Bragg reflector layer, and the full width at half maximum of the spectrum of the light is reduced. Thus, when the light emitted by the light-emitting devices leaves the display device, the light will have higher color purity to improve the display image. Besides, the projected area of the first distributed Bragg reflector layer or the second distributed Bragg reflector layer on the backplane is larger than the projected area of one light-emitting device on the backplane. Thus, the first distributed Bragg reflector layer or the second distributed Bragg reflector layer may be manufactured whole layer. It is not required to separately manufacture the first distributed Bragg reflector layer or the second distributed Bragg reflector layer on each light-emitting device. Therefore, the display device is easy to manufacture and has favorable cost-effectiveness.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 5A is a cross-sectional view of a display device according to another embodiment of the invention.

FIG. 5B is an enlarged view of a region A2 according to the embodiment of FIG. 5A.

FIG. 6A is a cross-sectional view of a display device according to yet another embodiment of the invention.

FIG. 6B is an enlarged view of a region A3 according to the embodiment of FIG. 6A.

DESCRIPTION OF THE EMBODIMENTS

Figure 1A:
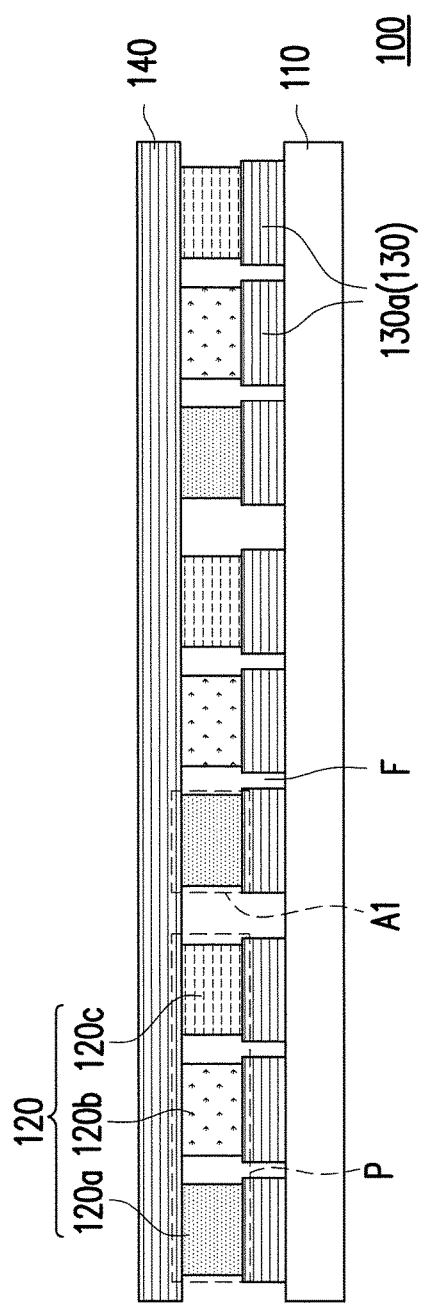
FIG. 1A is a cross-sectional view of a display device according to an embodiment of the invention.

FIG. 1A is a cross-sectional view of a display device according to an embodiment of the invention. Please refer to FIG. 1A. In this embodiment, a display device 100 includes a backplane 110, a plurality of light-emitting devices 120, a first distributed Bragg reflector (DBR) layer 130, and a second distributed Bragg reflector layer 140. The light-emitting devices 120 are disposed on the backplane 110. The first distributed Bragg reflector layer 130 is disposed between the backplane 110 and the light-emitting devices 120, and the light-emitting devices 120 are disposed between the first distributed Bragg reflector layer 130 and the second distributed Bragg reflector layer 140. Specifically, a projected area of the first distributed Bragg reflector layer 130 or a projected area of the second distributed Bragg reflector layer 140 on the backplane 110 is larger than a projected area of one light-emitting device 120 on the backplane 110. More specifically, in this embodiment, the projected areas of the first distributed Bragg reflector layer 130 and the second distributed Bragg reflector layer 140 on the backplane 110 are both larger than the projected area of each light-emitting device 120 on the backplane 110. In this embodiment, the light-emitting devices 120 are held between the first distributed Bragg reflector layer 130 and the second distributed Bragg reflector layer 140, wherein the second distributed Bragg reflector layer 140 is an entire film layer.

In this embodiment, the light-emitting devices 120 are arranged on the backplane 110 to form a plurality of pixels P of the display device 100. The light-emitting devices 120 emit light to display an image. In addition, the light-emitting devices 120 may also be applied to a projection system to project a colorful projection image. Specifically, the light-emitting devices 120 include a plurality of red light-emitting devices 120a, green light-emitting devices 120b, and blue light-emitting devices 120c respectively located in a plurality of sub pixels. Each pixel P includes three sub pixels in the embodiment. One light-emitting device 120a, one light-emitting device 120b, and one light-emitting device 120c are located in one of the pixels. In other embodiments, however, the light-emitting devices 120 in each pixel P may have other colors, such as yellow, or the light-emitting devices 120 with different emitting color may be disposed in other arrangements according to the actual display requirements. Furthermore, in other embodiments, one light-emitting device 120 may emit light of one single color, or one light-emitting device 120 may emit lights of different colors. Nevertheless, the invention is not limited thereto. In addition, the number of the sub pixels included in each pixel P and the number of the light-emitting devices 120 thereof may be changed to achieve multi-color display, single-color display, or other display effects. Nevertheless, the invention is not limited thereto.

In this embodiment, the light-emitting devices 120 (the light-emitting device 120*a*, the light-emitting device 120*b*, and the light-emitting device 120*c*) are light-emitting diode (LED) chips, for example. Specifically, the light-emitting devices 120 are micro-LED (μLED) chips that have been miniaturized, and a diagonal length of each light-emitting device 120 falls in a range of 2 μm to 150 μm, for example. In relevant embodiments, the light-emitting devices 120 may be arranged as different required or have different emitting color, so as to achieve full-color display or projection effect. The invention is not intended to limit the color selection and arrangement of the light-emitting devices 120. The color selection of the light-emitting devices 120 or the arrangement thereof on the backplane 110 may be adjusted according to different requirements of use, design specifications, and product positioning.

Figure 1B:
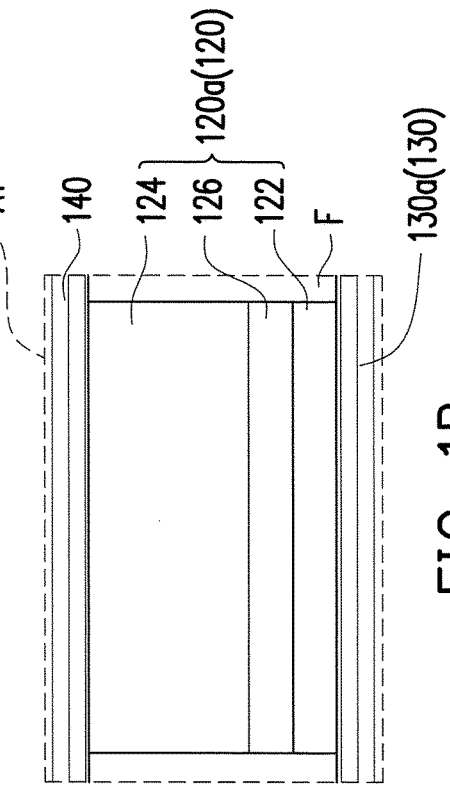
FIG. 1B is an enlarged view of a region A1 according to the embodiment of FIG. 1A.

FIG. 1B is an enlarged view of a region A1 according to the embodiment of FIG. 1A. Please refer to FIG. 1B. In this embodiment, the light-emitting device 120*a*, the light-emitting device 120*b*, and the light-emitting device 120*c* have similar structures, and the light-emitting devices 120 emit lights of different colors depending on material component. Here, the light-emitting device 120*a* is described as an example to illustrate the structure of each light-emitting device 120 in this embodiment. Specifically, each light-emitting device 120 includes a first type semiconductor layer 122, an active layer 126, and a second type semiconductor layer 124, wherein the active layer 126 is disposed between the first type semiconductor layer 122 and the second type semiconductor layer 124. More specifically, a material of the first type semiconductor layer 122, the second type semiconductor layer 124, and the active layer 126 may be a II-VI group material (e.g., ZnSe), a III-V nitride material (e.g., GaN, AlN, InN, InGaN, AlGaN, or AlInGaN), or a semiconductor material suitable for electroluminescence. Nevertheless, the invention is not limited thereto. Moreover, one of the first type semiconductor layer 122 and the second type semiconductor layer 124 is a P type doped semiconductor layer and the other of the first type semiconductor layer 122 and the second type semiconductor layer 124 is an N type doped semiconductor layer. In other words, the first type semiconductor layer 122 and the second type semiconductor layer 124 are semiconductor layers of two different doping types. Due to the different doping types, the first type semiconductor layer 122 and the second type semiconductor layer 124 have different thicknesses. In this embodiment, the thinner layer serves as the first type semiconductor layer 122 while the thicker layer serves as the second type semiconductor layer 124. Thus, the active layer 126 is close to the backplane 110, such that the light-emitting devices 120 have better heat dissipation. For example, the first type semiconductor layer 122 is a P type doped semiconductor layer and the second type semiconductor layer 124 is an N type doped semiconductor layer. Besides, the active layer 126 includes a multiple quantum well (MQW) structure or a quantum well (QW) structure, for example. Nevertheless, the invention is not limited thereto.

Please refer to FIG. 1A and FIG. 1B. In this embodiment, the first type semiconductor layer 122 is disposed between the active layer 126 and the first distributed Bragg reflector layer 130, and the second type semiconductor layer 124 is disposed between the second distributed Bragg reflector layer 140 and the light-emitting layer 126. At least one of the first distributed Bragg reflector layer 130 and the second distributed Bragg reflector layer 140 is electrically conductive. Specifically, the first distributed Bragg reflector layer 130 has electrical conductivity and includes a plurality of sub Bragg reflector structures 130*a* that are separated from one another. Each sub Bragg reflector structure 130*a* is corresponding to one of the light-emitting device 120 in this embodiment. A projected area of each sub Bragg reflector structure 130*a* on the backplane 110 is larger than the projected area of one light-emitting device 120 on the backplane 110. The first type semiconductor layer 122 of each light-emitting device 120 is electrically connected with one sub Bragg reflector structure 130*a*. In other words, the light-emitting device 120 of each sub pixel and the sub Bragg reflector structure 130*a* thereunder are separated from each other on the backplane 110. Moreover, a gap between the light-emitting devices 120 and a gap between the sub Bragg reflector structures 130*a* are filled with a filler F. The filler F electrically insulates the adjacent two sub Bragg reflector structures 130*a*. The filler F may be a light-transmissive, translucent, or opaque plastic material or a photoresist material. Nevertheless, the invention is not limited thereto.

Furthermore, in this embodiment, the second distributed Bragg reflector layer 140 also has electrical conductivity, and the second type semiconductor layers 124 of the light-emitting devices 120 are all electrically connected with the second distributed Bragg reflector layer 140. In the embodiment, the second distributed Bragg reflector layer 140 is a common electrode layer to the light-emitting devices 120. Specifically, the material of at least one of the first distributed Bragg reflector layer 130 and the second distributed Bragg reflector layer 140 includes silver. Alternatively, the materials of the first distributed Bragg reflector layer 130 and the second distributed Bragg reflector layer 140 may be included other electrically conductive materials. Additionally, in this embodiment, the backplane 110 includes a circuit structure (not shown), and the light-emitting devices 120 are electrically connected to the circuit structure through the sub Bragg reflector structures 130*a* electrically contacted with a plurality of contacts of the circuit structure. Besides, the second distributed Bragg reflector layer 140 may also be electrically connected with the circuit structure on the backplane 110. Therefore, the light-emitting devices 120 disposed on the backplane 110 may be respectively driven by a current transmitted by the circuit structure to emit light. Specifically, the backplane 110 having different circuit structure designs may be a semiconductor substrate, a submount substrate, a complementary metal-oxide-semiconductor (CMOS) circuit substrate, a liquid crystal on silicon (LCOS) substrate, or other types of substrates. The type of the backplane 110 and the circuit structure corresponding to the backplane 110 may be adjusted according to different requirements of use, design specifications, and product positioning. Thus, the invention is not limited to the above.

In this embodiment, the first distributed Bragg reflector layer 130 and the second distributed Bragg reflector layer 140 are respectively formed by stacking two materials that have different refractive indexes, and the reflectivity of the first distributed Bragg reflector layer 130 is different from the reflectivity of the second distributed Bragg reflector layer 140. Specifically, the reflectivity of the first distributed Bragg reflector layer 130 is greater than the reflectivity of the second distributed Bragg reflector layer 140. The reflectivity of the first distributed Bragg reflector layer 130 is 99% and the reflectivity of the second distributed Bragg reflector layer 140 is 40%, for example. The light emitted by the light-emitting devices 120 is reflected between the first distributed Bragg reflector layer 130 and the second distributed Bragg reflector layer 140 and leaves the display device 100 from the second distributed Bragg reflector layer 140. With different design of the refractive indexes and thicknesses of the stacking materials of the first distributed Bragg reflector layer 130 and the second distributed Bragg reflector layer 140, a wavelength of the light emitted by the light-emitting devices 120 is adjusted after the light is reflected between the first distributed Bragg reflector layer 130 and the second distributed Bragg reflector layer 140. Specifically, a full width at half maximum of a spectrum of the light is gradually reduced after one or more reflections. Thus, the wavelength distribution of the spectrum of the light becomes narrower when the light leaves the display device 100, and the display image will have higher color purity. Specifically, the full width at half maximum of the spectrum of the light emitted by the light-emitting devices 120 falls in a range of 30 nm to 40 nm, for example. The light emitted by the light-emitting devices 120 will resonate by reflecting between the first distributed Bragg reflector layer 130 and the second distributed Bragg reflector layer 140, after the light leaves the display device 100, the full width at half maximum of the spectrum of the light measured outside the display device 100 is reduced to a range of 10 nm to 25 nm, for example. In other words, the full width at half maximum of the spectrum of the light-emitting devices 120 is able to reduce 16% to 75%, so as to increase straight light intensity and color purity of the light-emitting devices 120. In other embodiments, however, the full width at half maximum of the spectrum of the light emitted by the light-emitting devices 120 may be other values. Preferably, the design of the first distributed Bragg reflector layer 130 and the second distributed Bragg reflector layer 140 improves the full width at half maximum of the spectrum of the light-emitting devices 120 at least 40% to 90%. Moreover, in these embodiments, the light-emitting performance of the display device 100 may be adjusted through other proper structural designs. Thus, the invention is not limited to the above.

Specifically, in the embodiment of the invention, the first distributed Bragg reflector layer 130 or the second distributed Bragg reflector layer 140 has a projected area on the backplane 110, which is larger than the projected area of one light-emitting device 120 on the backplane 110. In other words, the first distributed Bragg reflector layer 130 or the second distributed Bragg reflector layer 140 is manufactured on the backplane 110 or on those light-emitting devices 120 by entire film formation. Thus, it is not required to individually manufacture the first distributed Bragg reflector layer 130 or the second distributed Bragg reflector layer 140 on each light-emitting device 120 in advance. Therefore, the display device 100 is easy to manufacture and has lower cost. In this embodiment, the second distributed Bragg reflector layer 140 is manufactured as a whole film layer on the light-emitting devices 120 and the filler F. In addition, a projected area of each sub Bragg reflector structure 130*a* on the backplane 110 is different from the projected area of the light-emitting device 120, which is disposed on the sub Bragg reflector structure 130*a*, on the backplane 110. Specifically, the projected area of the sub Bragg reflector structure 130*a* on the backplane 110 is larger than the projected area of the light-emitting device 120 on the backplane 110.

Figure 2:
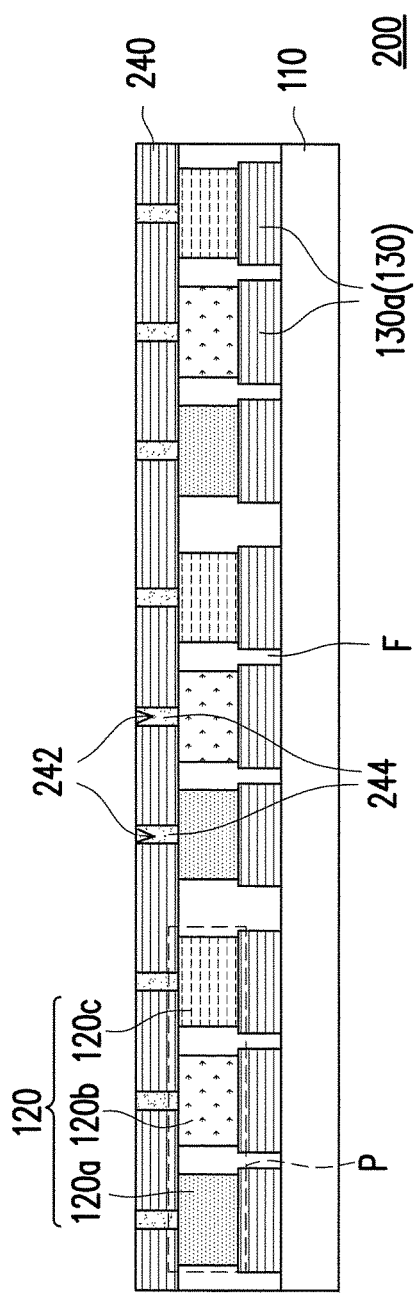
FIG. 2 is a cross-sectional view of a display device according to another embodiment of the invention.

FIG. 2 is a cross-sectional view of a display device according to another embodiment of the invention. A display device 200 of the embodiment of FIG. 2 is similar to the display device 100 of the embodiment of FIG. 1A to FIG. 1B. Please refer to the display device 100 described in the embodiment of FIG. 1A to FIG. 1B for details of the components of the display device 200. Thus, descriptions thereof are not repeated hereinafter. A main difference between the display device 200 and the display device 100 is as follows. In this embodiment, a second distributed Bragg reflector layer 240 of the display device 200 is an insulator, it means that the second distributed Bragg reflector layer 240 is not electrically conductive. The second distributed Bragg reflector layer 240 includes a plurality of conductive through holes 242 filled with an electrically conductive material 244, and the second type semiconductor layer 124 of each light-emitting device 120 is electrically connected with the electrically conductive material 244 in one conductive through hole 242. In addition, the electrically conductive materials 244 in the conductive through holes 242 may be electrically connected with the circuit structure (not shown) in common on the backplane 110 or other external circuits, for example.

Specifically, the first type semiconductor layers 122 of the light-emitting devices 120 of the display device 200 are electrically connected with the circuit structure of the backplane 110 through the sub Bragg reflector structures 130*a* having conductivity, and the second type semiconductor layers 124 of the light-emitting devices 120 are electrically connected with the circuit structure of the backplane 110 through the conductive through holes 242 and the electrically conductive materials 244. Therefore, the light-emitting layers 126 of the light-emitting devices 120 disposed on the backplane 110 may be respectively driven by the backplane 110. In this embodiment, the projected area of the first distributed Bragg reflector layer 130 or the second distributed Bragg reflector layer 240 on the backplane 110 is larger than the projected area of one light-emitting device 120 on the backplane 110. Specifically, the projected area of one sub Bragg reflector structure 130*a* on the backplane 110 is larger than the projected area of the corresponding light-emitting device 120 on the backplane 110. Therefore, the display image of the display device 200 has higher color purity, and the display device 200 is easy to manufacture and has favorable cost-effectiveness.

Figure 3:
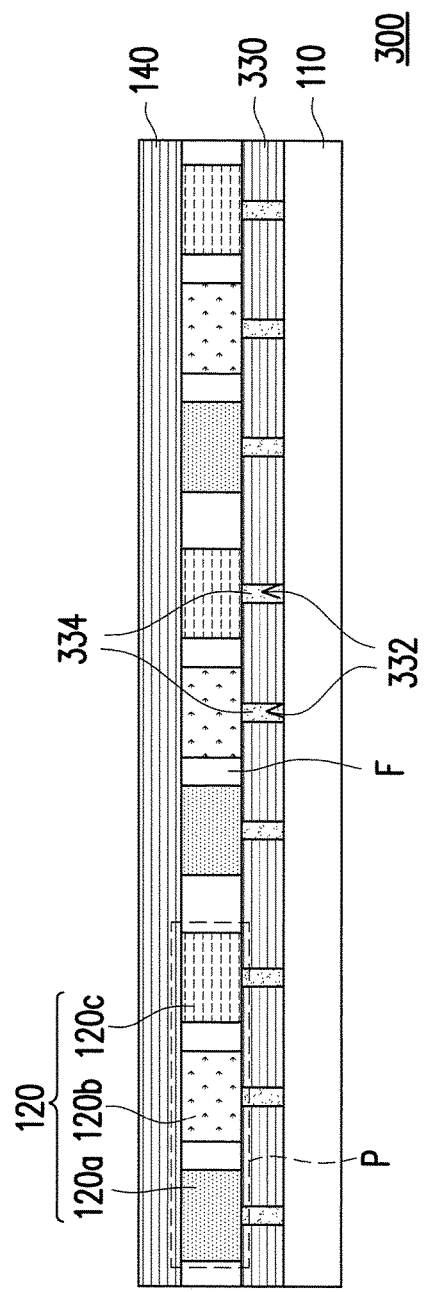
FIG. 3 is a cross-sectional view of a display device according to yet another embodiment of the invention.

FIG. 3 is a cross-sectional view of a display device according to another embodiment of the invention. A display device 300 of the embodiment of FIG. 3 is similar to the display device 100 of the embodiment of FIG. 1A to FIG. 1B. Please refer to the display device 100 for details of the components of the display device 300. Thus, descriptions thereof are not repeated hereinafter. A main difference between the display device 300 and the display device 100 is as follows. In this embodiment, a first distributed Bragg reflector layer 330 of the display device 300 is an insulator, not electrically conductive, and the second distributed Bragg reflector layer 140 is electrically conductive. Moreover, the first distributed Bragg reflector layer 330 includes a plurality of conductive through holes 332 that are disposed separately and respectively correspond to the light-emitting devices 120, and the first type semiconductor layer 122 of each light-emitting device 120 is electrically connected with an electrically conductive material 334 in one conductive through hole 332. Furthermore, the electrically conductive materials 334 in the conductive through holes 332 are electrically connected with the circuit structure (not shown) on the backplane 110 respectively, for example.

Specifically, the light-emitting devices 120 are electrically connected with the circuit structure of the backplane 110 through the electrically conductive materials 334 of the conductive through holes 332, and through the second distributed Bragg reflector layer 140. Therefore, the active layers 126 of the light-emitting devices 120 disposed on the backplane 110 may be respectively driven by the backplane 110. In this embodiment, the projected area of the first distributed Bragg reflector layer 330 or the projected area of the second distributed Bragg reflector layer 140 on the backplane 110 is larger than the projected area of one light-emitting device 120 on the backplane 110. Therefore, the display image of the display device 300 has higher color purity, and the display device 300 is easy to manufacture and has favorable cost-effectiveness.

Figure 4:
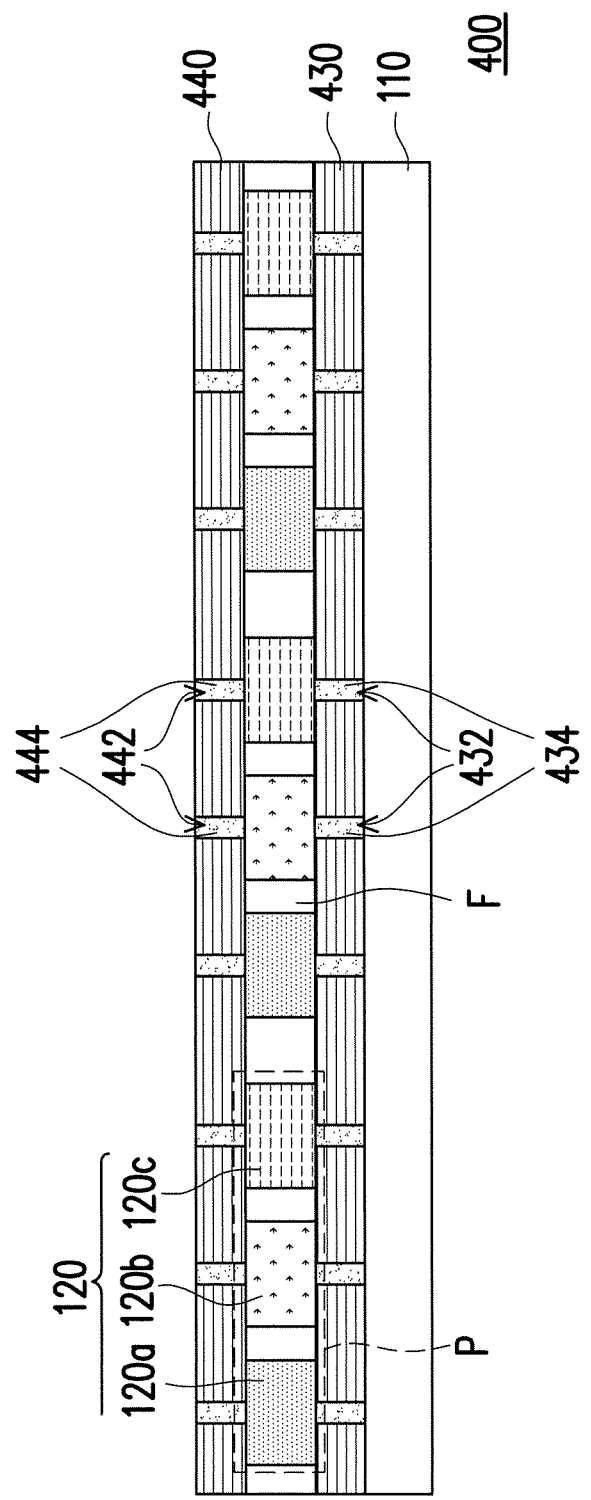
FIG. 4 is a cross-sectional view of a display device according to yet another embodiment of the invention.

FIG. 4 is a cross-sectional view of a display device according to yet another embodiment of the invention. A display device 400 of the embodiment of FIG. 4 is similar to the display device 300 of the embodiment of FIG. 3. Please refer to the display device 300 described in the embodiment of FIG. 3 for details of the components of the display device 400. Thus, descriptions thereof are not repeated hereinafter. A main difference between the display device 400 and the display device 300 is as follows. In this embodiment, a first distributed Bragg reflector layer 430 and a second distributed Bragg reflector layer 440 of the display device 400 are insulated layer. In addition, at least one of the first distributed Bragg reflector layer 430 and the second distributed Bragg reflector layer 440 includes a multilayer film. In some embodiments, the first distributed Bragg reflector layer 430 and the second distributed Bragg reflector layer 440 may include other insulating materials or non-conductive structures. Nevertheless, the invention is not limited thereto. Moreover, in this embodiment, the first distributed Bragg reflector layer 430 includes a plurality of first conductive through holes 432, and the first type semiconductor layer 122 of each light-emitting device 120 is electrically connected with an electrically conductive material 434 of one first conductive through hole 432. The second distributed Bragg reflector layer 440 includes a plurality of second conductive through holes 442, and the second type semiconductor layer 124 of each light-emitting device 120 is electrically connected with an electrically conductive material 444 of one second conductive through hole 442. In addition, the electrically conductive materials 434、444 are electrically connected with the circuit structure (not shown) on the backplane 110 respectively.

Specifically, the light-emitting devices 120 are electrically connected with the backplane 110 through the first conductive through holes 432 and the second conductive through holes 442. Therefore, the active layers 126 of the light-emitting devices 120 disposed on the backplane 110 may be respectively driven by the backplane 110. In this embodiment, both the first distributed Bragg reflector layer 430 and the second distributed Bragg reflector layer 440 are formed with entire film layer and the holes are formed afterwards. Therefore, it is not required other subsequent processes (process of cutting or bonding the backplane 110, for example) after respectively forming the first distributed Bragg reflector layer 430 and the second distributed Bragg reflector layer 440 on the light-emitting devices 120. The display image of the display device 400 has higher color purity, and the display device 400 is easy to manufacture and has favorable cost-effectiveness.

FIG. 5A is a cross-sectional view of a display device according to another embodiment of the invention. FIG. 5B is an enlarged view of a region A2 according to the embodiment of FIG. 5A. A display device 500 of the embodiment of FIG. 5A to FIG. 5B is like the display device 100 of the embodiment of FIG. 1A to FIG. 1B. Please refer to the display device 100 for details of the components of the display device 500. Thus, descriptions thereof are not repeated hereinafter. A main difference between the display device 500 and the display device 100 is as follows. In this embodiment, the light-emitting devices 520 (including a red light-emitting device 520a, a green light-emitting device 520b, and a blue light-emitting device 520c) of the display device 500 include a first type semiconductor layer 522, an active layer 526, and a second type semiconductor layer 524, wherein the active layer 526 is disposed between the first type semiconductor layer 522 and the second type semiconductor layer 524. In addition, the light-emitting device 520 further includes a first electrode 527, a second electrode 528, and an insulation layer IS. The first electrode 527 contacts electrically with the first type semiconductor layer 522, and the second electrode 528 contacts electrically with the second type semiconductor layer 524. Moreover, the insulation layer IS is formed on the surfaces of the first type semiconductor layer 522, the active layer 526, and the second type semiconductor layer 524 to electrically insulate the first electrode 527 from the second type semiconductor layer 524 and the active layer 526. The insulation layer IS may be formed together with the filler F with use of the same material or be formed individually. Specifically, the first type semiconductor layer 522 of each light-emitting device 520 has a surface S that faces the active layer 526. The surface S has a first portion surface S1 and a second portion surface S2. Moreover, the active layer 526 covers the first portion surface S1 and exposes the second portion surface S2. In this embodiment, the light-emitting devices 520 are horizontal structured micro-LED (μLED) chips, for example, which are different from the vertical structured light-emitting devices 120 (micro-LED (μLED) chips) of the embodiment of FIG. 1A to FIG. 1B.

In this embodiment, the second distributed Bragg reflector layer 540 is an insulator and includes a plurality of first conductive through holes 542 filled with an electrically conductive material 546 and a plurality of second conductive through holes 544 filled with the electrically conductive material 546. The first type semiconductor layer 522 of each light-emitting device 520 is electrically connected with the electrically conductive material 546 of one of the first conductive through holes 542 through the first electrode 527, and the second type semiconductor layer 524 of each light-emitting device 520 is electrically connected with the electrically conductive material 546 of one of the second conductive through holes 544 through the second electrode 528. The first conductive through holes 542 and the second conductive through holes 544 electrically connect with the circuit structure (not shown) on the backplane 110 respectively, the light-emitting devices 520 electrically connect to the circuit structure on the backplane 110 respectively. Furthermore, the first conductive through holes 542 and the second conductive through holes 544 are located on the same side of the light-emitting devices 520. In this embodiment, the first distributed Bragg reflector layer 530 located on the other side of the light-emitting devices 520 is electrically insulating to the light-emitting devices 520. For example, the first distributed Bragg reflector layer 530 includes a non-conductive multilayer film. Nevertheless, the invention is not limited thereto.

In this embodiment, the projected area of the first distributed Bragg reflector layer 530 or the projected area of the second distributed Bragg reflector layer 540 on the backplane 110 is larger than the projected area of one light-emitting device 520 on the backplane 110.

Figure 5C:
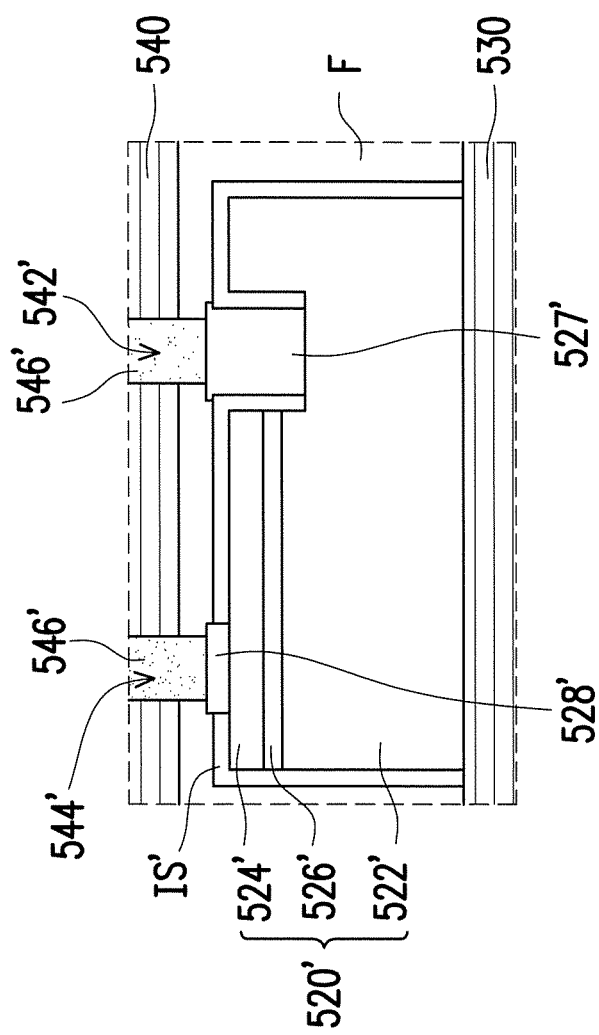
FIG. 5C is an enlarged view of a region according to another structural form of the embodiment of FIG. 5A.

FIG. 5C is an enlarged view of a region according to another light-emitting device structure of the embodiment of FIG. 5A. Please refer to FIG. 5C. A light-emitting device 520' is like the light-emitting device 520 shown in FIG. 5B. A main difference between the light-emitting device 520' and the light-emitting device 520 is as follows. The light-emitting device 520' includes a first type semiconductor layer 522', an active layer 526', a second type semiconductor layer 524', a first electrode 527', a second electrode 528', and an insulation layer IS'. The insulation layer IS' electrically insulates the first electrode 527' from the second type semiconductor layer 524' and the active layer 526'. Specifically, the first electrode 527' is electrically connected with the first type semiconductor layer 522' through a via hole, such that the first type semiconductor layer 522' is electrically connected with the electrically conductive material 546' of the first conductive through hole 542' through the first electrode 527'. In addition, the second type semiconductor layer 524' is electrically connected with the electrically conductive material 546' of the second conductive through hole 544' through the second electrode 528'.

FIG. 6A is a cross-sectional view of a display device 600 according to yet another embodiment of the invention. FIG. 6B is an enlarged view of a region A3 according to the embodiment of FIG. 6A. The display device 600 is like the display device 500 of the embodiment of FIG. 5A to FIG. 5B. Please refer to the display device 500 for details of the components of the display device 600. Thus, descriptions thereof are not repeated hereinafter. A main difference between the display device 600 and the display device 500 is as follows. In this embodiment, the light-emitting devices 620 (including a red light-emitting device 620a, a green light-emitting device 620b, and a blue light-emitting device 620c) include a first type semiconductor layer 622, an active layer 626, and a second type semiconductor layer 624, wherein the active layer 626 is disposed between the first type semiconductor layer 622 and the second type semiconductor layer 624. In addition, the light-emitting device 620 further includes a first electrode 627, a second electrode 628, and an insulation layer IS. The first electrode 627 is in contact electrically with the first type semiconductor layer 622, and the second electrode 628 is in contact electrically with the second type semiconductor layer 624. The insulation layer IS is formed on the surfaces of the first type semiconductor layer 622, the active layer 626, and the second type semiconductor layer 624, so as to electrically insulate the first electrode 627 from the second type semiconductor layer 624 and the active layer 626. Specifically, the first type semiconductor layer 622 has a surface S facing the light-emitting layer 626. The surface S has a first portion surface S1 and a second portion surface S2. Moreover, the light-emitting layer 626 covers the first portion surface S1 and exposes the second portion surface S2. In this embodiment, the first distributed Bragg reflector structure 630 is electrically insulated and includes a plurality of first conductive through holes 632 filled with an electrically conductive material 636 and a plurality of second conductive through holes 634 filled with the electrically conductive material 636. The first type semiconductor layer 622 of each light-emitting device 620 is electrically connected with the first conductive through hole 632 through the first electrode 627, and the second type semiconductor layer 624 of each light-emitting device 620 is electrically connected with the second conductive through hole 634 through the second electrode 628. The light-emitting devices 620 electrically connect to the circuit structure (not shown) of the backplane 110 by the first conductive through holes 632 and the second conductive through holes 634 respectively, for example. Furthermore, the first conductive through holes 632 and the second conductive through holes 634 are located on the same side of the light-emitting devices 620. In this embodiment, the second distributed Bragg reflector layer 640 includes a multilayer film that is formed with insulating material. Nevertheless, the invention is not limited thereto.

Specifically, the light-emitting layers 626 of the light-emitting devices 620 disposed on the backplane 110 may be respectively driven by the circuit structure of the backplane 110. In this embodiment, the first distributed Bragg reflector layer 630 or the second distributed Bragg reflector layer 640 is manufactured by the entire layer on two opposite sides of the light-emitting devices 620 respectively. Thus, the projected area of the first distributed Bragg reflector layer 630 or the second distributed Bragg reflector layer 640 on the backplane 110 is larger than the projected area of one light-emitting device 620 on the backplane 110. Therefore, the display device 600 has higher color purity, and the display device 600 is easy to manufacture and has favorable cost-effectiveness.

Figure 6C:
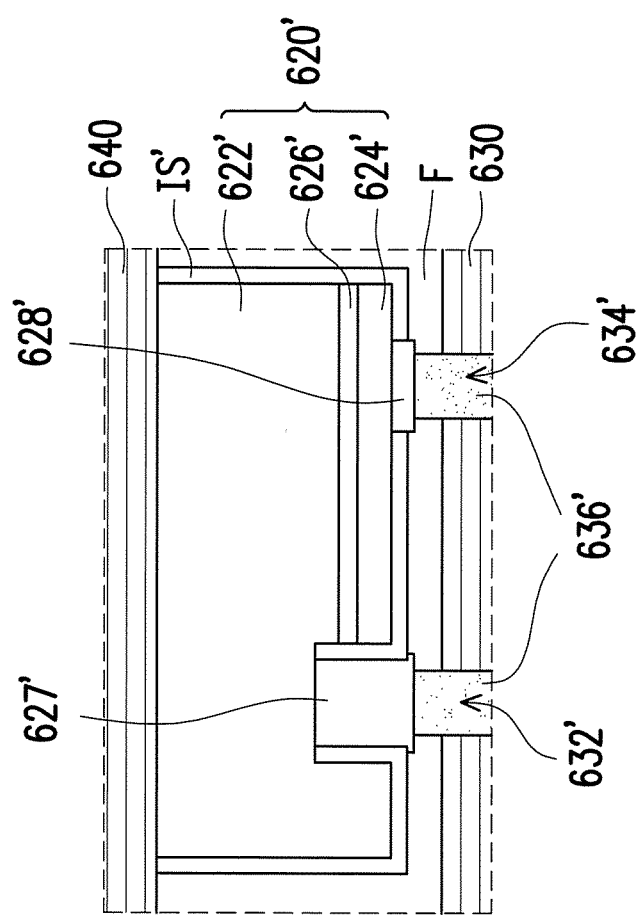
FIG. 6C is an enlarged view of a region according to another structural form of the embodiment of FIG. 6A.

FIG. 6C is an enlarged view of a region according to another light-emitting device structure of the embodiment of FIG. 6A. A light-emitting device 620' is like the light-emitting device 620 shown in FIG. 6B. A main difference between the light-emitting device 620' and the light-emitting device 620 is as follows. The light-emitting device 620' includes a first type semiconductor layer 622', an active layer 626', a second type semiconductor layer 624', a first electrode 627', a second electrode 628', and an insulation layer IS'. The insulation layer IS' electrically insulates the first electrode 627' from the second type semiconductor layer 624' and the active layer 626'. Specifically, the first electrode 627' is electrically connected with the first type semiconductor layer 622' through a via hole, such that the first type semiconductor layer 622' is electrically connected with the electrically conductive material 636' of the first conductive through hole 632' through the first electrode 627'. In addition, the second type semiconductor layer 624' is electrically connected with the electrically conductive material 636' of the second conductive through hole 634' through the second electrode 628'.

Based on the above, in the display device of the embodiments of the invention, the first distributed Bragg reflector layer is disposed between the backplane and the active devices, and the light-emitting devices are disposed between the first distributed Bragg reflector layer and the second distributed Bragg reflector layer. The light emitted by the light-emitting devices is reflected between the first distributed Bragg reflector layer and the second distributed Bragg reflector layer, and the full width at half maximum of the spectrum of the light will reduced when leave the second distributed Bragg reflector layer. Besides, the projected area of the first distributed Bragg reflector layer or the second distributed Bragg reflector layer on the backplane is larger than the projected area of one light-emitting device on the backplane. Thus, the first distributed Bragg reflector layer or the second distributed Bragg reflector layer may be manufactured with entire film on all the light-emitting devices to manufacture easily, and the process has favorable cost-effectiveness.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A display device, comprising:
a backplane;
a plurality of light-emitting devices disposed on the backplane;
a first distributed Bragg reflector layer disposed between the backplane and the light-emitting devices; and
a second distributed Bragg reflector layer, wherein the light-emitting devices are disposed between the first distributed Bragg reflector layer and the second distributed Bragg reflector layer, and a projected area of the first distributed Bragg reflector layer on the backplane is larger than a projected area of one of the light-emitting devices on the backplane or a projected area of the second distributed Bragg reflector layer on the backplane is larger than a projected area of one of the light-emitting devices on the backplane.

2. The display device according to claim 1, wherein each of the light-emitting devices comprises a first type semiconductor layer, an active layer, and a second type semiconductor layer, wherein the active layer is disposed between the first type semiconductor layer and the second type semiconductor layer, the first type semiconductor layer is disposed between the active layer and the first distributed Bragg reflector layer, and the second type semiconductor layer is disposed between the second distributed Bragg reflector layer and the active layer, wherein at least one of the first distributed Bragg reflector layer and the second distributed Bragg reflector layer is conductive.

3. The display device according to claim 2, wherein the first distributed Bragg reflector layer is conductive and comprises a plurality of sub Bragg reflector structures that are separated from one another, and the first type semiconductor layer of each of the light-emitting devices is electrically connected with one of the sub Bragg reflector structures.

4. The display device according to claim 3, wherein the second distributed Bragg reflector layer is conductive, and the second type semiconductor layers of the light-emitting devices are electrically connected with the second distributed Bragg reflector layer.

5. The display device according to claim 3, wherein the second distributed Bragg reflector layer is an insulator and comprises a plurality of conductive through holes, and the second type semiconductor layer of each of the light-emitting devices is connected with one of the conductive through holes.

6. The display device according to claim 2, wherein the first distributed Bragg reflector layer is electrically insulated while the second distributed Bragg reflector layer is conductive, and the first distributed Bragg reflector layer comprises a plurality of conductive through holes, wherein the first type semiconductor layer of each of the light-emitting devices is connected with one of the conductive through holes of the first distributed Bragg reflector layer, and the second type semiconductor layers of the light-emitting devices are electrically connected with the second distributed Bragg reflector layer.

7. The display device according to claim 2, wherein a material of at least one of the first distributed Bragg reflector layer and the second distributed Bragg reflector layer comprises silver.

8. The display device according to claim 1, wherein each of the light-emitting devices comprises a first type semiconductor layer, an active layer, and a second type semiconductor layer, wherein the active layer is disposed between the first type semiconductor layer and the second type semiconductor layer, the first type semiconductor layer is disposed between the active layer and the first distributed Bragg reflector layer, and the second type semiconductor layer is disposed between the second distributed Bragg reflector layer and the active layer, wherein at least one of the first distributed Bragg reflector layer and the second distributed Bragg reflector layer is electrically insulated.

9. The display device according to claim 8, wherein the first distributed Bragg reflector layer and the second distributed Bragg reflector layer are electrically insulated, and the first distributed Bragg reflector layer comprises a plurality of first conductive through holes, and the first type semiconductor layer of each of the light-emitting devices is connected with one of the first conductive through holes, wherein the second distributed Bragg reflector layer comprises a plurality of second conductive through holes, and the second type semiconductor layer of each of the light-emitting devices is connected with one of the second conductive through holes.

10. The display device according to claim 8, wherein the first distributed Bragg reflector layer is electrically insulated, and the first distributed Bragg reflector layer comprises a plurality of first conductive through holes and a plurality of second conductive through holes, wherein the first type semiconductor layer of each of the light-emitting devices is connected with one of the first conductive through holes, and the second type semiconductor layer of each of the light-emitting devices is connected with one of the second conductive through holes.

11. The display device according to claim 8, wherein the second distributed Bragg reflector layer is electrically insulated, and the second distributed Bragg reflector layer comprises a plurality of first conductive through holes and a plurality of second conductive through holes, wherein the first type semiconductor layer of each of the light-emitting devices is connected with one of the first conductive through holes, and the second type semiconductor layer of each of the light-emitting devices is connected with one of the second conductive through holes.

12. The display device according to claim 1, wherein at least one of the first distributed Bragg reflector layer and the second distributed Bragg reflector layer comprises a multi-layer film.

13. The display device according to claim 1, wherein a reflectivity of the first distributed Bragg reflector layer is different from a reflectivity of the second distributed Bragg reflector layer.

14. The display device according to claim 1, wherein each of the light-emitting devices is a micro-LED, and a diagonal length of each of the light-emitting devices falls in a range of 2 µm to 150 µm.

15. The display device according to claim 1, wherein the light-emitting devices emit lights include different colors.

16. The display device according to claim 1, wherein the projected area of the second distributed Bragg reflector layer on the backplane is larger than the projected area of one of the light-emitting devices on the backplane.

* * * * *